United States Patent [19]

Daffner et al.

[11] 4,045,706
[45] Aug. 30, 1977

[54] ARRANGEMENT HAVING A TRAVELING-WAVE TUBE AND A CURRENT SUPPLY UNIT

[75] Inventors: Erich Daffner, Ottobrunn; Herbert Sarnezki, Munich, both of Germany

[73] Assignee: Siemens Aktiengesellschaft, Berlin & Munich, Germany

[21] Appl. No.: 686,138

[22] Filed: May 13, 1976

[30] Foreign Application Priority Data

May 28, 1975 Germany .............................. 2523689

[51] Int. Cl.² ............................................. H01J 25/34
[52] U.S. Cl. ..................................... 315/3.5; 315/3.6; 315/39.3
[58] Field of Search .......................... 315/3.5, 3.6, 39.3

[56] References Cited

U.S. PATENT DOCUMENTS

| 3,538,367 | 11/1970 | Sarnezki et al. .................. | 315/3.6 X |
| 3,593,059 | 7/1971 | Sarnezki ................................ | 315/3.6 |

*Primary Examiner*—Saxfield Chatmon, Jr.
*Attorney, Agent, or Firm*—Hill, Gross, Simpson, Van Santen, Steadman, Chiara & Simpson

[57] ABSTRACT

The invention relates to an arrangement comprising a traveling-wave tube mounted in a housing, and a power supply source enclosed by a separate housing.

Inventively, all electrical supply lines inside the tube housing are run to a plug mounted in this housing, projecting outward and enclosed by a sleeve of electrically conductive material. The invention further provides for a central singular electrical coupling matrix in the power source, whereby all electrical connecting lines to the traveling-wave tube are combined and connected to the outside via one electrical socket carried by this housing. Both housings can easily be mounted such that, when the plug connection is established, the plug sleeve is compressed. The invention provides a space-savingly designed unit of traveling-wave tube and current supply unit connected to each other with an HF-seal.

10 Claims, 3 Drawing Figures

ARRANGEMENT HAVING A TRAVELING-WAVE TUBE AND A CURRENT SUPPLY UNIT

BACKGROUND OF THE INVENTION

1. Field of the Invention

The invention relates to an improved arrangement having a traveling-wave tube which is accommodated in a housing having an elongated rectangular parallelepiped form and whose HF-coupling conductors are connectively mounted on one of the longitudinal sides of the housing. A power supply source unit also jacketed by a separate rectangular parallelpiped-shaped housing having a plug-in socket, is electrically connected to the traveling-wave tube by said plug-in socket on the power supply housing.

2. Prior Art

Interface units of this nature are already on the market. Frequently, however, only a very limited space, prescribed at least in two directions, is available for the tube and its power supply. Thus, for example, directional radio systems must be accommodated in slide-in modules with standardized width and depth. Starting with these parameters as a basis, the manufacturers of directional radio systems have changed to constructing each system section, i.e. tube and current supply as a rectangular parallelepiped, connecting each with one another in an electrically pluggable way and mounting them in an individually separable manner. The electrical connection thereby is generally established by a cable harness provided with an HF-plug, projecting out of the tube housing, and run to a reciprocal socket on the power supply housing. This solution, however, still unnecessarily wastes inordinate amounts of space since the cable harness cannot fall below a certain curvature radius. In addition, should one of the two components require disassembly and replacement without removing the other, sufficient space must be made available for this operation. Moreover, the available devices still give rise to serious problems in forming a complete, low cost, HF-seal around the plug.

SUMMARY OF THE INVENTION

The object of the present invention is to provide a space-savingly designed modular traveling-wave tube and power supply unit for interface with each other via an HF-seal which can be easily mounted and conveniently individually interchanged.

The object of the invention is realized by a traveling-wave tube unit having all electrical supply lines within the tube housing coupled to a singular first plug junction, preferably a requisite male plug, mounted in said housing and enclosed by a sleeve of electrically conductive material. The power supply unit also utilizes a second singular plug junction, preferably a female plug for receiving the male plug of said tube unit, wherein all electrical supply lines in said power supply are connected to said second plug junction. The tube housing and the power supply housing connect in such a way that when the plug interface is achieved, the plug sleeve is compressed, thereby insulating the interface appropriately from high frequencies.

In the proposed embodiment with tube-integrated plug junction, not only the accommodation problems connected with the use of a cable but also the problem of a high frequency insulation of the plug connection are overcome. The inventively provided plug contact minimizes the space requirement, and the plug sleeve, in the simplest case an O-ring of electrically conductive rubber, is inherently compressed during installation forming a line bridge insulated on all sides.

The power supply and tube can be anchored not only jointly, but also individually on a common front plate. In appropriate cases the front plate simultaneously serves for cooling, and is correspondingly ribbed, whereby various rib positions are prescribed to the manufacturer of the system comprising the tube and power supply. In this case it is recommended, to mount the nuts in the housings with bolted connections, and, at least in the tube housing, to give them a floating support. If the tube and power supply are to be positioned especially close to one another, then either the plug or the socket can be recessed in its respective housing.

In a separate embodiment, the plug may be on one of the two short sides of the tube housing and the socket on one of the four narrow sides of power supply housing, in particular on one of its two short sides. The above special arrangement between the two system components is especially found advantageous for separate HF and IF (intermediate frequency) level formation in directional radio systems.

On the basis of three sample embodiments depicted completely schematically in the figures of the drawing, the invention is now to be more specifically explained. Parts which correspond to each other thereby are provided with identical reference marks.

DESCRIPTION OF THE PREFERRED EMBODIMENT

Figure 1:
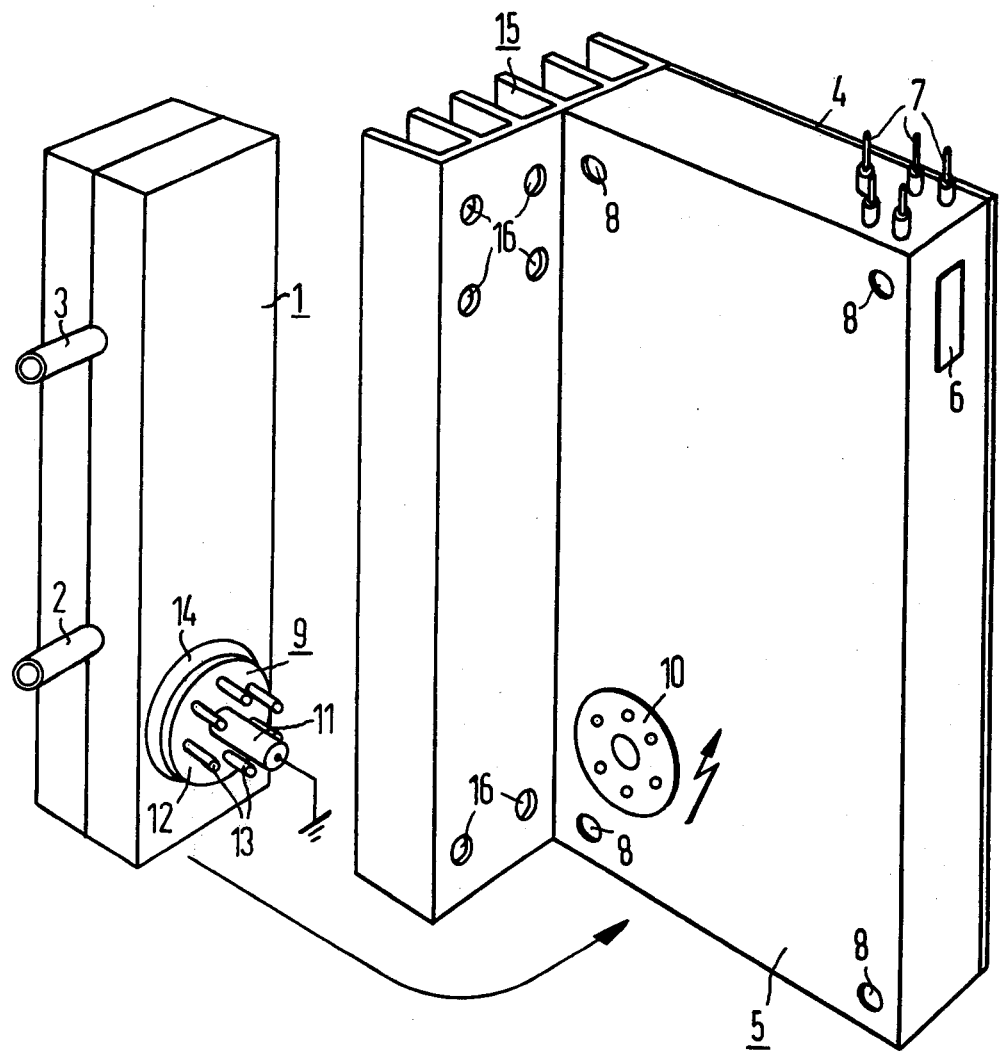
FIG. 1 is a perspective view depicting an insulated plug outlet mounted in a tube housing and a reciprocal plug socket mounted in a power supply housing in accordance with the principle of the invention.

For easy viewing, a tube housing 1 and a power supply housing 5 are represented as substantially exact rectangular parallelepiped with substantially completely flat surfaces. In reality, the system components can deviate from such a form, for example, individual edges or corners may be angled or individual sections may be rounded. In addition, individual walls can also be equipped with cooling ribs.

All three sample embodiments are intended for directional radio systems and are kept to the standardized dimensions of the "7 R" constructional type ($\sim$ 10 cm in width and 20 cm in depth). A tube (not shown) is always enclosed in a sanded aluminum housing cast of two longitudinal halves. The HF coupling conductors comprising an HF input 2 and an HF output 3 project through the housing. The power supply unit is also jacketed in a housing 5 made of sheet metal and HF is insulated by a cover 4. The power source housing additionally contains a low voltage connection 6, a plurality of 24-V connections 7 and attachment holes 8 at its corners.

In FIG. 1 the tube unit as depicted is removed from its functional position so that on the tube housing 1 a plug 9 and on the power source housing 5 a socket 10 is visible. The plug 9 is mounted on one of the housing's longitudinal sides in the region of the HF input 2 for coupling. The plug 9 contains a central lead 11, receiving the grounding line, as well as several contact prongs 13 grouped circumferentially around this lead and anchored to a plug base 12. The plug base is surrounded by a sleeve 14, such as an O-ring constructed of electrically conductive rubber. The reciprocal socket 10 receiving the plug 9 is located on a wide side of the power source housing 5. This connection is floating, for example, movable along a slot, and placed in such a way that, with the plug inserted, the two system components form a common front side. The housings are then bolted to a front plate 15 equipped with cooling ribs. The plate contains bore holes 16 for this purpose.

Figure 2:
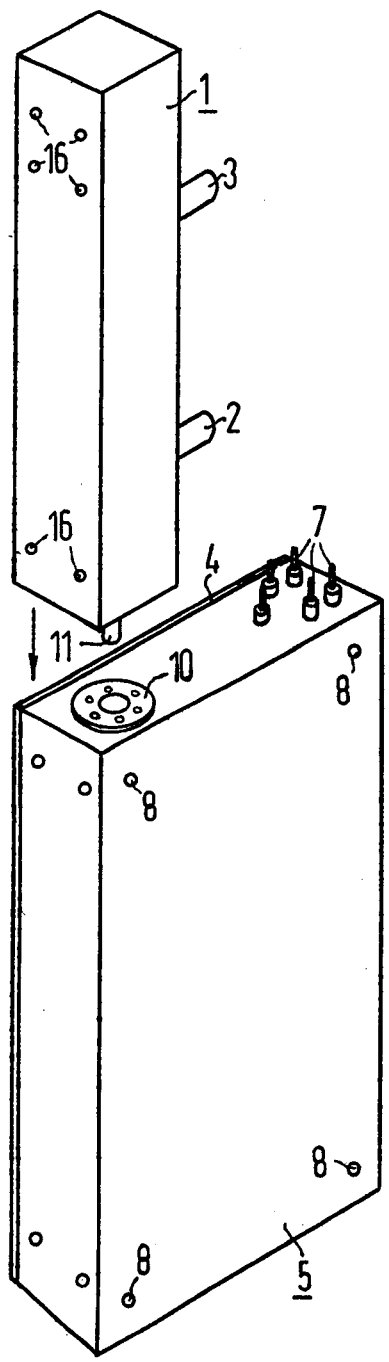
FIG. 2 is a perspective view depicting a tube housing and a plug housing interface in accordance with the additional embodiment of the invention.

A second embodiment (FIG. 2) differs from the depicted embodiment solely in the spatial arrangement of the two system sections as to each other. As can be derived from the Figure, the plug 9 is located at one of the two ends of the tube housing and said socket 10 at one of its two sides, ends of the power section of the socket 10 at one of its two sides, ends of the power section of the housing.

Figure 3:
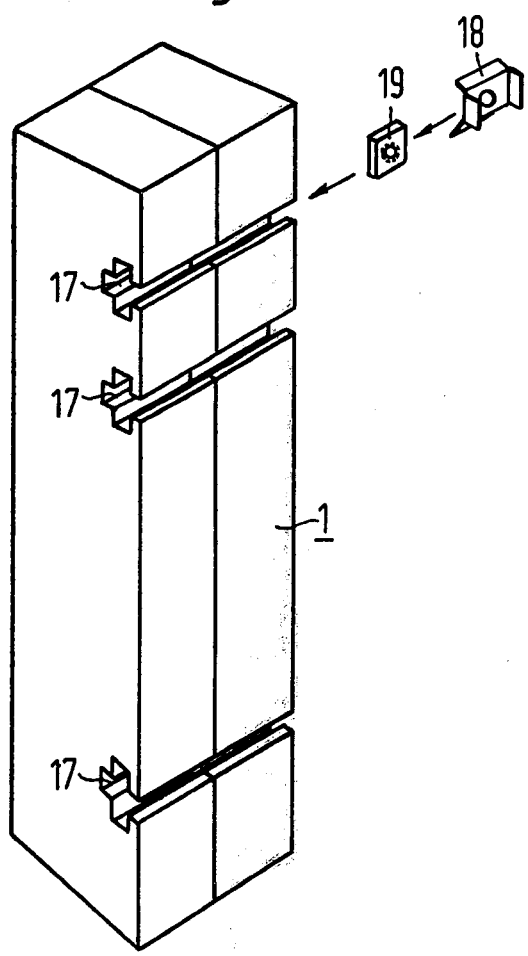
FIG. 3 is a perspective view depicting a mounting for the tube housing in accordance with the principle of the invention.

FIG. 3 shows a tube housing 1 having transverse slots 17 which receive floating mounting members 18 and 19 for attachment of the tube housing 1 to the power supply housing 5 as described for FIG. 1.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the following claims.

We claim:

1. An arrangement for modular directional radio systems comprising a traveling-wave tube mounted in a substantially parallelepiped tube housing with four longitudinal sides and two end sides having an HF plug outlet communicating with said tube and mounted in one of the sides of said housing, and a power unit mounted in a separate substantially parallelepiped power supply housing having a reciprocal plug socket mounted in said power supply housing communicating with said traveling-wave tube by means of said plug outlet, wherein all electrical connecting supply lines in said traveling-wave tube are connected to said plug outlet mounted in said tube housing and said plug outlet is enclosed by a sleeve means comprising an electrically conductive compressible material; all electrical connecting supply lines in said power supply unit directed to said traveling-wave tube are connected to said reciprocal plug socket; and, said sleeve means forming an electrically conductive high frequency seal around said outlet when the tube and power supply housings are interfaced, said sleeve means being compressed between said housings.

2. The arrangement as defined in claim 1 wherein the tube housing and the power source housing are each bolted on a common base provided with a plurality of cooling ribs.

3. The arrangement as defined in claim 1 wherein the plug socket is arranged floatingly.

4. The arrangement as defined in claim 1 wherein the plug outlet is arranged floatingly.

5. The arrangement as defined in claim 2 wherein the nuts provided for the bolting connection are floatingly mounted in the tube housing.

6. The arrangement as defined in claim 1 wherein the plug socket is recessed mounted in the power source housing.

7. The arrangement as defined in claim 1 wherein the plug outlet is recessed mounted in the tube housing.

8. The arrangement as defined in claim 1 wherein the plug socket is mounted in the wide side of the power source housing.

9. The arrangement as defined in claim 1 wherein the plug outlet is mounted in one of the end sides normal to the longitudinal sides of the tube housing and the plug socket in an end side of the power source housing.

10. The arrangement of claim 1 wherein said plug outlet is mounted in one of said four long sides of the tube housing.

* * * * *